US008049243B2

(12) United States Patent
Kamei et al.

(10) Patent No.: US 8,049,243 B2
(45) Date of Patent: Nov. 1, 2011

(54) GALLIUM NITRIDE-BASED COMPOUND SEMICONDUCTOR LIGHT EMITTING DEVICE

(75) Inventors: Koji Kamei, Ichihara (JP); Munetaka Watanabe, Chiba (JP); Noritaka Muraki, Ichihara (JP); Yasushi Ohno, Ichihara (JP)

(73) Assignee: Showa Denko K.K., Tokyo (JP)

( * ) Notice: Subject to any disclaimer, the term of this patent is extended or adjusted under 35 U.S.C. 154(b) by 259 days.

(21) Appl. No.: 11/597,413

(22) PCT Filed: May 19, 2005

(86) PCT No.: PCT/JP2005/009587

§ 371 (c)(1), (2), (4) Date: Feb. 27, 2008

(87) PCT Pub. No.: WO2005/117150

PCT Pub. Date: Dec. 8, 2005

(65) Prior Publication Data

US 2008/0315237 A1 Dec. 25, 2008

Related U.S. Application Data

(60) Provisional application No. 60/577,218, filed on Jun. 7, 2004.

(30) Foreign Application Priority Data

May 26, 2004 (JP) ................................ 2004-156543

(51) Int. Cl.
*H01L 33/00* (2010.01)

(52) U.S. Cl. ................................ 257/99; 257/E33.064

(58) Field of Classification Search .................. 257/103, 257/E33.025, 79, 99, E33.064
See application file for complete search history.

(56) References Cited

U.S. PATENT DOCUMENTS

| | | | | |
|---|---|---|---|---|
| 6,100,174 | A | 8/2000 | Takatani | |
| 2002/0158249 | A1* | 10/2002 | Tsuda et al. | 257/59 |
| 2002/0190263 | A1* | 12/2002 | Hata et al. | 257/103 |
| 2003/0168720 | A1* | 9/2003 | Kamada | 257/666 |

FOREIGN PATENT DOCUMENTS

| | | | |
|---|---|---|---|
| JP | 4-88684 | A | 3/1992 |
| JP | 9-129932 | A | 5/1997 |
| JP | 10-84160 | A | 3/1998 |
| JP | 2803742 | | 7/1998 |
| JP | 10-256184 | A | 9/1998 |

(Continued)

*Primary Examiner* — Thomas L Dickey
*Assistant Examiner* — Nikolay Yushin
(74) *Attorney, Agent, or Firm* — Sughrue Mion, PLLC

(57) ABSTRACT

This gallium nitride-based compound semiconductor light emitting device includes an n-type semiconductor layer, a light emitting layer, and a p-type semiconductor layer that are composed of gallium nitride-based compound semiconductors and are deposited in that order on a substrate, and further includes a negative electrode and a positive electrode that are in contact with the n-type semiconductor layer and the p-type semiconductor layer, respectively, wherein the positive electrode has a translucent electrode composed of a three-layer structure including a contact metal layer that contacts at least the p-type semiconductor layer, a current diffusion layer provided on the contact metal layer and having conductivity greater than that of the contact metal layer, and a bonding pad layer provided on the current diffusion layer, and a mixed positive electrode-metal layer including a metal that forms the contact metal layer is present in a positive electrode side surface of the p-type semiconductor layer.

14 Claims, 4 Drawing Sheets

FOREIGN PATENT DOCUMENTS

| | | | |
|---|---|---|---|
| JP | 10-303504 | | 11/1998 |
| JP | 1-186605 | | 7/1999 |
| JP | 11-186605 | A | 7/1999 |
| JP | 11-204887 | A | 7/1999 |
| JP | 2001-6716 | A | 1/2001 |
| JP | 2003-46127 | | 2/2003 |
| JP | 2003-243726 | | 8/2003 |

* cited by examiner

GALLIUM NITRIDE-BASED COMPOUND SEMICONDUCTOR LIGHT EMITTING DEVICE

The present application claims priority on Japanese Patent Application No. 2004-156543 filed on May 26, 2004 and on U.S. Provisional Patent Application No. 60/577,218 filed on Jun. 7, 2004, the contents of which are incorporated herein by reference.

TECHNICAL FIELD

The present invention relates to a gallium nitride-based semiconductor device, and more particularly, to a gallium nitride-based compound semiconductor device provided with a translucent positive electrode having superior characteristics and productivity.

BACKGROUND ART

GaN-based compound semiconductor materials have recently attracted attention as semiconductor materials for short wavelength light-emitting devices. GaN-based compound semiconductors are formed on substrates composed of sapphire single crystals, various other oxides, or III-V compounds by a method such as metalloorganic chemical vapor deposition (MOCVD) or molecular beam epitaxy (MBE).

One of the characteristics of GaN-based compound semiconductor materials is having low current diffusion in the horizontal direction. Although this is thought to be due to the presence of large numbers of dislocations penetrating from the substrate to the surface in epitaxial crystals, the details of this are not fully understood. Moreover, in p-type GaN-based compound semiconductors, the resistivity is higher than the resistivity of n-type GaN-based compound semiconductors, there is hardly any horizontal spreading of current in the p layer in the case in which metal is simply deposited on the surface thereof, thereby in the case of adopting an LED structure having a pn junction, light is only emitted downward directly beneath the positive electrode.

Consequently, current diffusivity is enhanced by electron beam irradiation or high-temperature annealing to lower the resistivity of the p layer. However, the cost of a device for electron beam irradiation is extremely high, making it incompatible with production costs. In addition, it is difficult to uniformly process the wafer surface. In the case of high-temperature annealing as well, although it is necessary to employ a process at a temperature of 900° C. or higher in order to yield remarkable effects, there is the risk of decomposition of the crystal structure of the GaN and deterioration of reverse voltage characteristics caused by the elimination of nitrogen.

In addition, it has also been proposed to deposite Ni and Au at 10 nm each on the p layer for use as the positive electrode, and carry out alloying treatment in an oxygen atmosphere to promote lower resistance of the p layer as well as form a translucent and ohmic positive electrode (see, for example, Japanese Patent No. 2803742).

However, alloying treatment in an oxygen atmosphere causes the formation of an oxide layer on the surface of the exposed n-type GaN layer, and has an ohmic effect on the negative electrode. Moreover, Au/Ni electrodes that have been subjected to alloying treatment in an oxygen atmosphere have mesh structures, resulting in increased susceptibility to the occurrence of emission unevenness, reduced mechanical strength and the need to provide a protective film, which in turn leads to increased production costs. Moreover, since the Ni is heat treated in an oxygen atmosphere, when Ni oxides cover the surface and a pad electrode is formed on the translucent electrode, it has weak adhesive strength thereby preventing the obtaining of bonding strength.

In addition, it has also been proposed to form a Pt layer on the p layer for use as the positive electrode followed by heat treatment in an atmosphere including oxygen to simultaneously carry out resistance reduction and alloying treatment of the p layer (see, for example, Japanese Unexamined Patent Application, First Publication No. H11-186605).

However, since this method also involves heat treatment in an oxygen atmosphere, it has the same problems as those described above. Moreover, although the translucent electrode must be considerably thin (5 nm or less) to obtain a satisfactory translucent electrode with Pt alone, this results in an increase in the electrical resistance of the Pt layer. Thus, even if resistance of the Pt layer is reduced by heat treatment, current spreading is poor and emission of light is not uniform, leading to an increase in forward voltage (VF) as well as a decrease in emission intensity.

DISCLOSURE OF THE INVENTION

In order to solve the aforementioned problems, the object of the present invention is to provide a gallium nitride-based compound semiconductor light emitting device provided with a positive electrode having satisfactory translucency, low contact resistance and superior current diffusivity without requiring electron beam irradiation, high-temperature annealing or alloying treatment in an oxygen atmosphere. In the present invention, translucency refers to translucency with respect to light in the wavelength range of 300 to 600 nm.

The present invention provides the following inventions.

(1) A gallium nitride-based compound semiconductor light emitting device includes an n-type semiconductor layer, a light emitting layer, and a p-type semiconductor layer that are composed of gallium nitride-based compound semiconductors and are deposited in that order on a substrate, and further includes a negative electrode and a positive electrode that are in contact with the n-type semiconductor layer and the p-type semiconductor layer, respectively, wherein the positive electrode has a translucent electrode composed of a three-layer structure including a contact metal layer that contacts at least the p-type semiconductor layer, a current diffusion layer provided on the contact metal layer and having conductivity greater than that of the contact metal layer, and a bonding pad layer provided on the current diffusion layer, and a mixed positive electrode-metal layer including a metal that forms the contact metal layer is present in a positive-electrode-side surface of the p-type semiconductor layer.

(2) The gallium nitride-based compound semiconductor light emitting device according to (1), wherein a thickness of the mixed positive electrode-metal layer is 0.1 to 10 nm.

(3) The gallium nitride-based compound semiconductor light emitting device according to (1) or (2), wherein a percentage of the metal that forms the contact metal layer in the mixed positive electrode-metal layer to a total metal in the mixed positive electrode-metal layer is 0.01 to 30 atomic percent.

(4) The gallium nitride-based compound semiconductor light emitting device according to any of (1) to (3), wherein a mixed semiconductor-metal layer that includes a group III metal is present in a p-type-semiconductor-layer-side surface of the contact metal layer.

(5) The gallium nitride-based compound semiconductor light emitting device according to (4), wherein a thickness of the mixed semiconductor-metal layer is 0.1 to 2.5 nm.

(6) The gallium nitride-based compound semiconductor light emitting device according to (4) or (5), wherein a percentage of the group III metal in the mixed semiconductor-metal layer to a total metal in the mixed semiconductor-metal layer is 0.1 to 50 atomic percent.

(7) The gallium nitride-based compound semiconductor light emitting device according to any of (1) to (6), wherein the contact metal layer is of a platinum group metal or Ag.

(8) The gallium nitride-based compound semiconductor light emitting device according to any of (1) to (7), wherein the contact metal layer is of platinum.

(9) The gallium nitride-based compound semiconductor light emitting device according to any of (1) to (8), wherein a thickness of the contact metal layer is 0.1 to 7.5 nm.

(10) The gallium nitride-based compound semiconductor light emitting device according to any of (1) to (9), wherein a thickness of the contact metal layer is 5 nm or less.

(11) The gallium nitride-based compound semiconductor light emitting device according to any of (1) to (10), wherein a thickness of the contact metal layer is 0.5 to 2.5 nm.

(12) The gallium nitride-based compound semiconductor light emitting device according to any of (1) to (11), wherein the current diffusion layer is of a metal selected from the group consisting of gold, silver, copper, and an alloy including at least one thereof.

(13) The gallium nitride-based compound semiconductor light emitting device according to any of (1) to (12), wherein the current diffusion layer is of gold.

(14) The gallium nitride-based compound semiconductor light emitting device according to any of (1) to (13), wherein a thickness of the current diffusion layer is 1 to 20 nm.

(15) The gallium nitride-based compound semiconductor light emitting device according to any of (1) to (14), wherein a thickness of the current diffusion layer is 10 nm or less.

(16) The gallium nitride-based compound semiconductor light emitting device according to any of (1) to (15), wherein a thickness of the current diffusion layer is 3 to 6 nm.

(17) The gallium nitride-based compound semiconductor light emitting device according to any of (1) to (16), wherein the bonding pad layer includes a eutectic solder material.

(18) The gallium nitride-based compound semiconductor light emitting device according to any of (1) to (17), wherein the bonding pad layer includes Au, Sn, or a tertiary solder alloy including Au and Sn.

A translucent positive electrode of the present invention, which is provided with a contact metal layer in the form of a thin layer of a metal such as a platinum group metal having low contact resistance with a p-type GaN-based compound semiconductor, and a current diffusion layer provided on the contact metal layer and having a larger conductivity than that of the contact metal layer, has improved spread of current in an in-plane direction of the electrode, and as a result, a high luminance light emitting device can be produced having a low forward voltage (VF) and uniform emission of light over the entire surface of the positive electrode.

BEST MODE FOR CARRYING OUT THE INVENTION

The following provides an explanation of preferred embodiments of the present invention with reference to the drawings. However, the present invention is not limited to each of the following embodiments, and for example, the constituents of these embodiments may be suitably combined.

Figure 1:
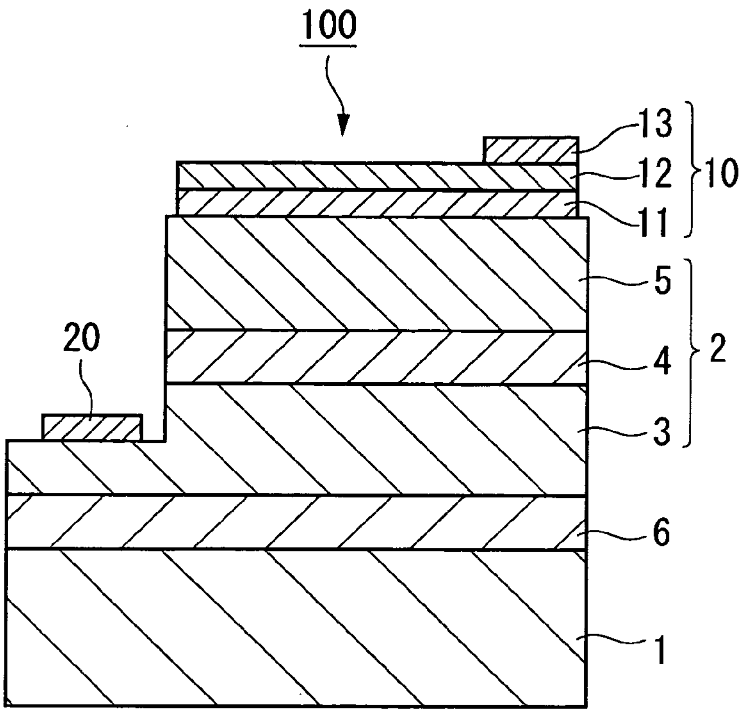
FIG. 1 is a schematic drawing showing a cross-sectional structure of a gallium nitride-based compound semiconductor light emitting device of the present invention.

FIG. 1 is a schematic drawing showing the cross-section of a gallium nitride-based compound semiconductor light emitting device 100 having a translucent positive electrode of the present invention.

This gallium nitride-based compound semiconductor light emitting device 100 of the present invention has a gallium nitride-based compound semiconductor layer 2 formed on a substrate 1 interposed with a buffer layer 6 between them, and a translucent positive electrode 10 of the present invention formed thereon.

Gallium nitride-based compound semiconductor layer 2 is composed with a hetero junction structure including, for example, an n-type semiconductor layer 3, a light emitting layer 4 and a p-type semiconductor layer 5.

A negative electrode 20 is formed in a portion of the n-type semiconductor layer 3, and the translucent positive electrode 10 is formed in a portion of the p-type semiconductor layer 5.

In addition, the translucent positive electrode 10 has three layers consisting of a contact metal layer 11, a current diffusion layer 12, and a bonding pad layer 13.

Small contact resistance with the p-type semiconductor layer 5 is essential for the required performance of the contact metal layer 11. Moreover, superior optical transmissivity is required for face-up mounting type light emitting devices in which light from the light emitting layer 4 is extracted from the electrode side.

A material of the contact metal layer 11 is preferably a platinum group metal such as platinum (Pt), ruthenium (Ru), osmium (Os), rhodium (Rd), iridium (Ir), or palladium (Pd), or silver (Ag) from the viewpoint of contact resistance with the p layer. Among these, Pt is particularly preferable since Pt has a high work function and allows to obtain a satisfactory ohmic contact without heating with the p-type GaN-based compound semiconductor layer which is not subjected to high-temperature heat treatment and has comparatively high resistance.

In the case in which the contact metal layer 11 includes a platinum group metal, it is necessary to make its thickness extremely thin from the viewpoint of optical transmissivity. The thickness of the contact metal layer 11 is preferably within a range from 0.1 to 7.5 nm. In the case in which the thickness is less than 0.1 nm, it is difficult to obtain a stable thin layer. In the case in which the thickness exceeds 7.5 nm, translucency decreases, and a thickness of 5 nm or less is more preferable. In addition, the thickness of the contact metal layer 11 is particularly preferably 0.5 to 2.5 nm in consideration of deposition stability and a decrease in the translucency caused by a subsequent deposition of the current diffusion layer 12.

However, since reducing the thickness of the contact metal layer 11 in this manner causes an increase in the electrical resistance in the planar direction of the contact metal layer 11, and the p layer has a comparatively high resistance, the current flows only in a periphery of the bonding pad layer 13 serving as a current injection area. As a result, light emission pattern is not uniform and emission output decreases.

Therefore, by arranging the current diffusion layer 12 which is composed of a metal thin film having high optical transmissivity and high conductivity on the contact metal layer 11 as a means of compensating for the current diffusivity of the contact metal layer 11, the current is able to spread uniformly without significantly impairing a low contact resistance and a optical transmissivity of the platinum group metal. As a result, a light emitting device having a high emission output can be obtained.

A material of the current diffusion layer 12 is preferably a metal having high conductivity, such as a metal selected from the group consisting of gold, silver, copper, and an alloy that includes at least one type of these metals. Gold is particularly preferable due to its high optical transmissivity when formed into a thin film.

A thickness of the current diffusion layer 12 is preferably 1 to 20 nm. In the case in which the thickness is less than 1 nm, current diffusion effects are not adequately demonstrated. In the case in which the thickness exceeds 20 nm, an optical transmissivity of the current diffusion layer 12 decreases remarkably, resulting in the risk of a decrease in emission output. A thickness of 10 nm or less is more preferable.

Moreover, when the thickness is made to be within a range from 3 to 6 nm, a balance between the effects of an optical transmissivity and a current diffusion of the current diffusion layer 12 becomes optimal, thereby, together with the aforementioned contact metal layer, high-output emission that is uniform over the entire surface of the positive electrode can be obtained.

In a gallium nitride-based compound semiconductor light emitting device of the present invention, a mixed positive electrode-metal layer including a metal that forms the aforementioned contact metal layer is made to be present in a positive-electrode-side surface of the p-type semiconductor layer 5. As a result of employing this constitution, an effect of lowering a contact resistance between the positive electrode 10 and the p-type semiconductor layer 5 is obtained.

In the present invention, the "mixed positive electrode-metal layer" is defined as a layer including a metal that forms the contact metal layer in the p-type semiconductor layer 5.

A thickness of the mixed positive electrode-metal layer is preferably 0.1 to 10 nm. In the case in which the thickness is less than 0.1 or greater than 10 nm, it is difficult to obtain a low contact resistance. The thickness is more preferably 1 to 8 nm to obtain even better contact resistance.

In addition, a ratio of the metal that forms the contact metal layer included in the mixed positive electrode-metal layer is preferably 0.01 to 30 atomic percent relative to the total amount of metal. In the case in which the ratio is less than 0.01 atomic percent, it is difficult to obtain a low contact resistance, and in the case in which the ratio exceeds 30 atomic percent, there is a risk of causing a poor semiconductor crystallinity. The ratio is preferably 1 to 20 atomic percent. Here, the mixed positive electrode-metal layer may also include a metal that forms a reflecting layer. In this case, the aforementioned ratio is evaluated as a value of the amount of the metal that forms the contact metal layer and the amount of the metal that forms the reflecting layer.

The thickness of the mixed positive electrode-metal layer and the ratio of the metal that forms the positive electrode included therein can be measured by an EDS analysis of a cross-sectional TEM that is known among persons with ordinary skills in the art. Namely, the EDS analysis of the cross-sectional TEM is performed at several points, for example 5 points, in a direction of thickness from an upper surface (surface on the positive electrode side) of the p-type semiconductor layer, and the metals included along with their amounts are determined from the chart at each point. When the measurement at five points is not adequate for determining the thickness, measurements should be made at additional points to determine the thickness.

Moreover, in the case in which a mixed semiconductor-metal layer including a metal that composes a semiconductor is made to be present in a semiconductor-side surface of the contact metal layer 11 of the positive electrode, a contact resistance can be lowered even more, thereby making this preferable. Namely, in the present invention, the "mixed semiconductor-metal layer" is defined as a layer that includes a metal that composes a semiconductor in the contact metal layer.

A thickness of the mixed semiconductor-metal layer is preferably 0.1 to 3 nm. In the case in which the thickness is less than 0.1 nm, the effect of lowering the contact resistance is not remarkable. In the case in which the thickness exceeds 3 nm, the optical transmissivity decreases, which is not preferable. The thickness is more preferably 1 to 2.5 nm.

In addition, a ratio of the metal that composes the semiconductor included in the mixed semiconductor-metal layer is preferably 0.1 to 50 atomic percent relative to the total amount of metal. In the case in which the ratio is less than 0.1 atomic percent, the effect of lowering the contact resistance is not remarkable. In the case in which the ratio exceeds 50 atomic percent, there is the risk of decreasing the optical transmissivity. This ratio is more preferably 1 to 20 atomic percent.

Measurement of the thickness of the mixed semiconductor-metal layer and the content of the metal that composes the semiconductor can be carried out by an EDS analysis of a cross-sectional TEM in the same manner as for the mixed positive electrode-metal layer.

There are no particular limitations on the method used to deposit the contact metal layer 11 and the current diffusion layer 12, and a known method such as vacuum deposition or sputtering can be used.

Various structures using various materials are known for the bonding pad layer 13 that composes the bonding pad area, and these known structures and materials can be used without any particular limitations. However, it is desirable to use a material having satisfactory adhesion with the current diffusion layer, and it is necessary that a thickness be sufficiently thick so as not to impart damage to the contact metal layer 11 or the current diffusion layer 12 by a stress generated during bonding. In addition, an uppermost layer preferably includes a material having satisfactory adhesion with a bonding ball.

As shown in FIG. 1, the translucent positive electrode 10 of the present invention can be used without any limitations for a gallium nitride-based compound semiconductor light emitting device known in the prior art, in which the gallium nitride-based compound semiconductor layer 2 is deposited on the substrate 1 with the buffer layer 6 interposed therebetween, and the n-type semiconductor layer 3, the light emitting layer 4, and the p-type semiconductor layer 5 are formed.

A known substrate material can be used without any limitations for the substrate 1, examples of which include sapphire single crystal ($Al_2O_3$; A surface, C surface, M surface, and R surface), spinel single crystal ($MgAl_2O_4$), ZnO single crystal, $LiAlO_2$ single crystal, $LiGaO_2$ single crystal, MgO single crystal, and other oxide single crystals, Si single crystal, SiC single crystal, GaAs single crystal, AlN single crystal, GaN single crystal, and $ZrB_2$ single crystal and other boride single crystals. Here, there are no particular limitations on a plane direction of the substrate 1. In addition, substrates having a surface exactly oriented to a crystal plane, or an off-angle may also be used.

Various types of structures of the n-type semiconductor layer 3, the light emitting layer 4, and the p-type semiconductor layer 5 are known, and these known structures can be used without limitation. In particular, although a typical concentration is used for the carrier concentration of the p-type semiconductor layer 5, the translucent positive electrode of the present invention can also be applied to as an electrode for the p-type semiconductor layers having comparatively low carrier concentrations, for example, a carrier concentration of about $1\times10^{17}$ $cm^{-3}$.

Semiconductors of various compositions represented by the general formula $Al_xIn_yGa_{1-x-y}N$ ($0\leqq x<1$, $0\leqq y<1$, $0\leqq x+y<1$) are known for the gallium nitride-based compound semiconductors that form the light-emitting device, and various compositions of semiconductors represented by the general formula $Al_xIn_yGa_{1-x-y}N$ ($0\leqq x<1$, $0\leqq y<1$, $0\leqq x+y<1$) can be used without limitation for the n-type semiconductor layer, the light emitting layer, and the p-type semiconductor layer in the present invention.

There are no particular limitations on a growth method of these gallium nitride-based compound semiconductors, and all known methods for growing group III nitride semiconductors can be applied, examples of which include metalloorganic chemical vapor deposition (MOCVD), hydride vapor phase epitaxy (HVPE), and molecular beam epitaxy (MBE). A preferable growth method is MOCVD from the viewpoint of a film thickness controllability and a mass production.

In the MOCVD method, hydrogen ($H_2$) or nitrogen ($N_2$) is used as a carrier gas, trimethyl gallium (TMG) or triethyl gallium (TEG) is used as a Ga source serving as a group III material, trimethyl aluminum (TMA) or triethyl aluminum (TEA) is used as an Al source, trimethyl indium (TMI) or triethyl indium (TEI) is used as an In source, and ammonia ($NH_3$) or hydrazine ($N_2H_4$) is used as a N source serving as a group V material. In addition, examples of dopants used as an n type include Si material of monosilane ($SiH_4$) or disilane ($Si_2H_6$) and a Ge material of germane ($GeH_4$), while examples of dopants used for the p type include a Mg material of bis-cyclopentadienyl magnesium ($Cp_2Mg$) or bis-ethylcyclopentadienyl magnesium ($(EtCp)_2Mg$).

In order to form the negative electrode 20 in contact with the n-type semiconductor layer 3 of the gallium nitride-based compound semiconductor 2 in which the n-type semiconductor layer 3, the light emitting layer 4, and the p-type semiconductor layer 5 are sequentially deposited on the substrate 1, portions of the light emitting layer 4 and the p-type semiconductor layer 5 are removed to expose the n-type semiconductor layer 3. Subsequently, the translucent positive electrode 10 of the present invention is then formed on the remaining p-type semiconductor layer 5, and the negative electrode 20 is formed on the exposed n-type semiconductor layer 3. Negative electrodes having various compositions and structures are known for the negative electrode 20, and these known negative electrodes can be used without limitation.

EXAMPLE

Next, the following provides a more detailed explanation of the present invention through its embodiments, however the present invention is not limited to these embodiments.

Example

Figure 2:
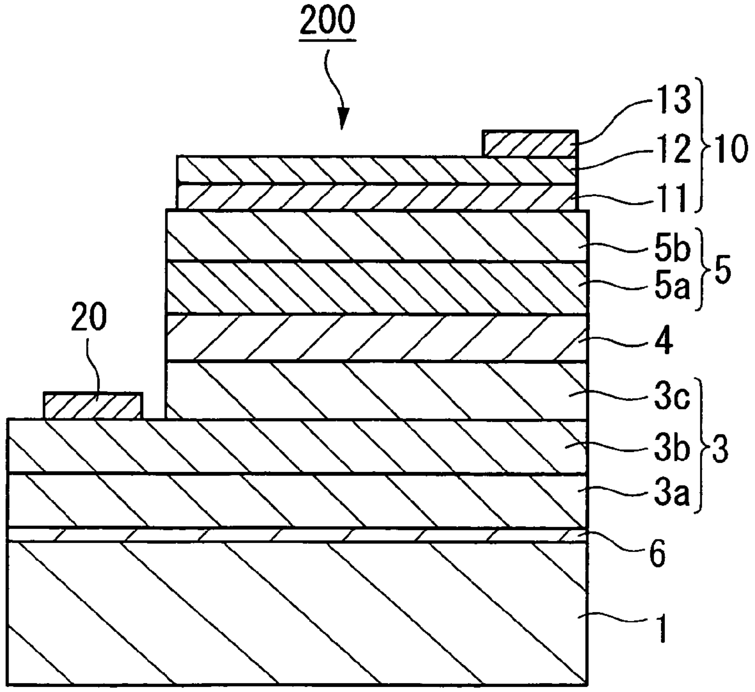
FIG. 2 is a schematic drawing showing a cross-sectional structure of a gallium nitride-based compound semiconductor light emitting device of an embodiment of the present invention.
Figure 3:
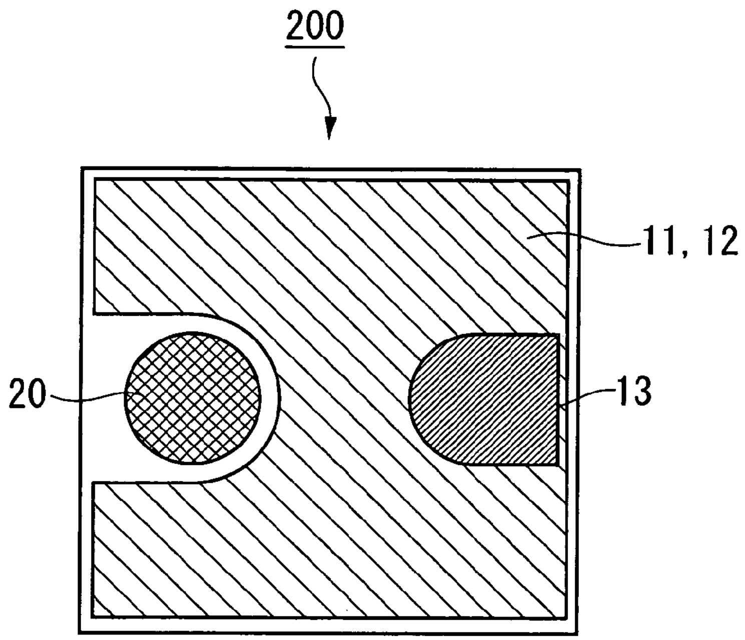
FIG. 3 is a schematic drawing showing an overhead view of a gallium nitride-based compound semiconductor light emitting device of an embodiment of the present invention.

FIG. 2 is a schematic drawing showing the cross-section of a gallium nitride-based compound semiconductor light emitting device 200 produced in the present example. FIG. 3 is a schematic drawing of its overhead view. A base layer 3*a* composed of undoped GaN and having a thickness of 3 μm; a Si-doped n-type GaN contact layer 3*b* having a thickness of 2 μm; an n-type $In_{0.1}Ga_{0.9}N$ cladding layer 3*c* having a thickness of 0.03 μm; a light emitting layer 4 with a multiple-quantum-well structure formed by depositing an Si-doped GaN barrier layer having a thickness of 0.03 μm and an $In_{0.2}Ga_{0.8}N$ well layer having a thickness of 2.5 nm five times and finally providing a barrier layer; an Mg-doped p-type $Al_{0.07}Ga_{0.93}N$ cladding layer 5*a* having a thickness of 0.05 μm; and an Mg-doped p-type GaN contact layer 5*b* having a thickness of 0.15 μm were deposited sequentially on a sapphire substrate 1 with a buffer layer 6 composed of AlN intervening.

A positive electrode 10 composed of a contact metal layer 11 composed of Pt and having a thickness of 1.5 nm, a current diffusion layer 12 composed of Au and having a thickness of 5 nm, and a bonding pad layer 13 having a five-layer structure consisting of Au, Ti, Al, Ti, and Au in that order was formed on the p-type GaN contact layer 5*b* of the gallium nitride-based compound semiconductor 2. Thicknesses of these layers were 50, 20, 10, 100, and 200 nm, respectively.

Next, a negative electrode 20 having a bilayer structure consisting of Ti and Au was formed on the n-type GaN contact layer 3*b* to obtain a light emitting device in which a light emission face is on a semiconductor side. Overhead views of the positive electrode 10 and the negative electrode 20 were as shown in FIG. 3.

In a light emitting device employing this structure, a carrier concentration in the n-type GaN contact layer 3*b* was $1\times10^{19}$ $cm^{-3}$, an amount of doped Si in the GaN barrier layer was $1\times10^{18}$ $cm^{-3}$, a carrier concentration in the p-type GaN contact layer 5*b* was $5\times10^{18}$ $cm^{-3}$, and an amount of doped Mg in the p-type AlGaN cladding layer 5*a* was $5\times10^{19}$ $cm^{-3}$.

Deposition of the gallium nitride-based compound semiconductor layer 3 was carried out by MOCVD method under ordinary conditions well known in the relevant technical field. In addition, the positive electrode 10 and the negative electrode 20 were formed according to the following procedure.

A portion of the n-type GaN contact layer 3*b* that forms the negative electrode was initially exposed by a reactive ion etching according to the following procedure.

First, an etching mask was formed on the p-type semiconductor layer 5. The forming procedure was as described below. After uniformly coating a resist over an entire surface, the resist was removed over a region larger than a periphery of the positive electrode region using a known lithography technology. The substrate was then placed in a vacuum deposition device, and Ni and Ti were deposited at film thicknesses of about 50 nm and 300 nm, respectively, by an electron beam method at a pressure of $4\times10^{-4}$ Pa. The metal film other than the positive electrode region was then removed along with the resist by a liftoff technology.

Next, the semiconductor deposited substrate was then placed on an electrode in an etching chamber of a reaction ion sputtering device, and after reducing a pressure in the etching chamber to $10^{-4}$ Pa, $Cl_2$ gas as an etching gas was fed into the chamber and etching was carried out until the n-type GaN contact layer 3*b* was exposed. Following etching, the deposited substrate was taken out of the reaction ion etching device and the etching mask was removed with nitric acid and hydrofluoric acid.

Next, a contact metal layer 11 including Pt and a current diffusion layer 12 including Au were formed only at a region in which the positive electrode was formed on the p-type GaN contact layer 5*b* using a known photolithography and liftoff technologies. In a formation of the contact metal layer 11 and the current diffusion layer 12, the substrate 1 on which gallium nitride-based compound semiconductor layer 3 was deposited was first placed in a vacuum deposition device, and at first Pt at 1.5 nm and secondary Au at 5 nm were deposited on the p-type GaN contact layer 5*b*. After taking out of the vacuum chamber, the deposited substrate was treated in accordance with a known procedure ordinarily referred to as a liftoff, after which a first layer including Au, a second layer including Ti, a third layer including Al, a fourth layer including Ti, and a fifth layer including Au were sequentially deposited on a portion of the current diffusion layer 12 to form a bonding pad layer 13 using the same procedure. A positive electrode 10 of the present invention was thus formed on the p-type GaN contact layer 5*b* in this manner.

The positive electrode formed by this method demonstrated translucency, and had an optical transmissivity of 60% in a 470 nm wavelength range. Here, the optical transmissivity was measured by using a sample in which the same contact metal layer and the current diffusion layer were formed to sizes for measurement of the optical transmissivity.

Figure 4:
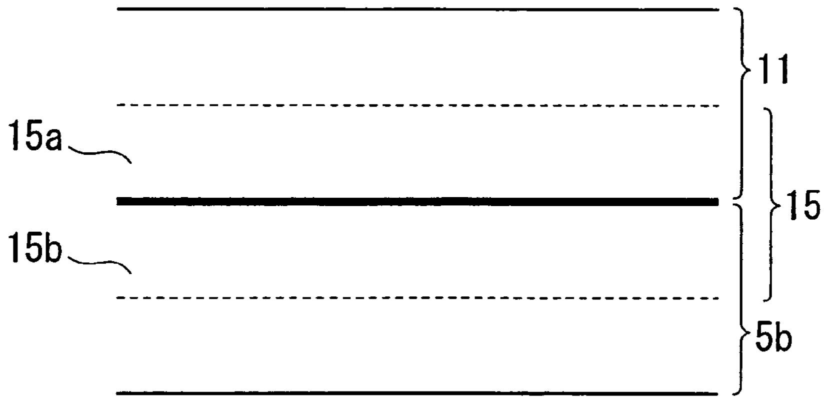
FIG. 4 is a drawing showing an enlarged view of the vicinity of the junction between a p-type semiconductor layer and a contact metal layer of a gallium nitride-based compound semiconductor light emitting device of the present invention.

FIG. 4 shows an enlarge view of a vicinity of a junction between the p-type semiconductor layer and the contact metal layer of the gallium nitride-based compound semiconductor light emitting device of the present invention.

As shown in FIG. 4, in a gallium nitride-based compound semiconductor light emitting device of the present invention, a mixed positive electrode-metal layer 15*b* including a metal that forms the contact metal layer 11 is present in a vicinity of a contact-metal-layer-11-side interface of the p-type semiconductor layer 5*b*, while a mixed semiconductor-metal layer 15*a* including a metal that composes semiconductor layer 2 is present in a vicinity of a p-type-semiconductor-layer-5*b*-side interface on of the contact metal layer 11. Namely, the mixed semiconductor-metal layer 15*a* and the mixed positive electrode-metal layer 15*b* form a mutual diffusion layer 15 at the interface of the junction between the contact metal layer 11 and the p-type semiconductor layer 5*b*. The presence of this mutual diffusion layer 15 makes it possible to demonstrate the effect of obtaining a junction interface having superior current diffusivity with low resistance.

Furthermore, as a result of an EDS analysis of a cross-sectional TEM, a thickness of the mixed semiconductor-metal layer 15*a* was found to be 1.5 nm, and a ratio of Ga in the layer was estimated to be 1 to 20 atomic percent with respect to a total amount of metal (Pt+Au+Ga). In addition, a thickness of the mixed positive electrode-metal layer 15*b* was 6.0 nm, a positive electrode material present was Pt that composed the contact metal layer 11, and its ratio in the layer was estimated to be 1 to 10 atomic percent relative to a total amount of metal (Pt+Ga). Here, FIG. 5 shows an example of an EDS analysis chart of a cross-sectional TEM of the contact metal layer, while FIG. 6 shows an example of an EDS analysis chart of a cross-sectional TEM of the contact layer 5*b*.

Figure 5:
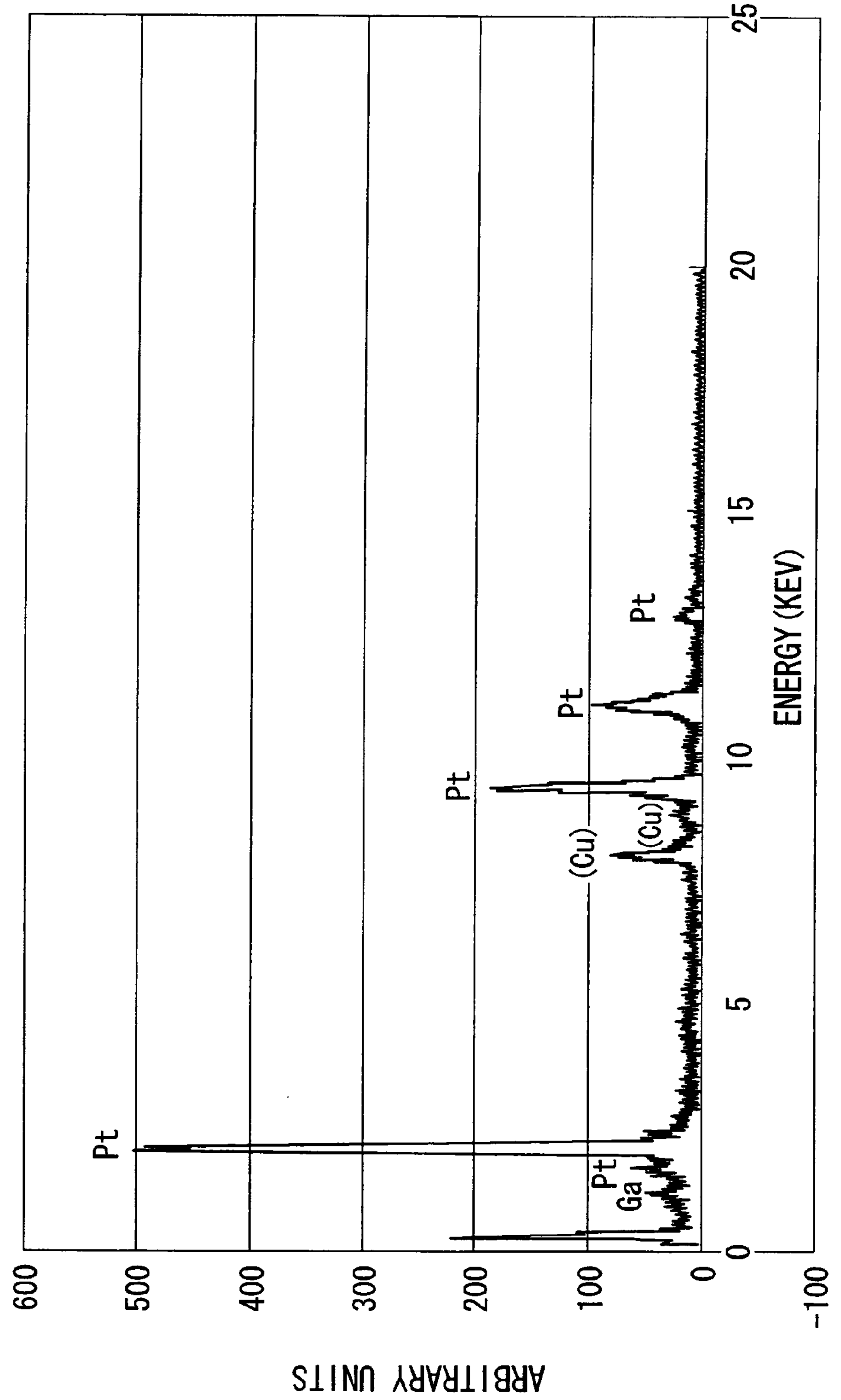
FIG. 5 is an example of an EDS analysis chart of cross-sectional TEM performed on a contact metal layer of a gallium nitride-based compound semiconductor light emitting device of the present invention.
Figure 6:
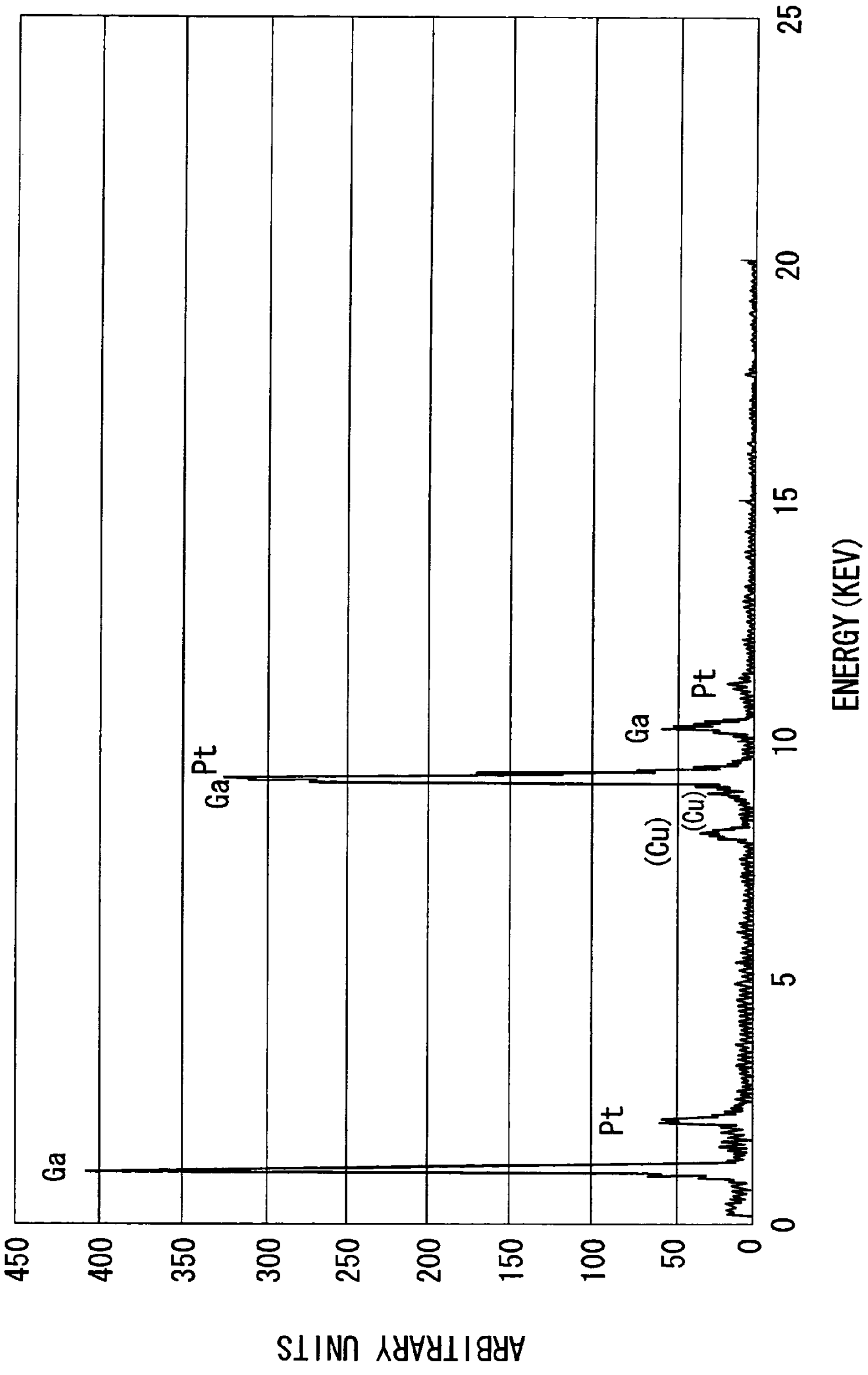
FIG. 6 is an example of an EDS analysis chart of cross-sectional TEM performed on a p-type semiconductor layer of a gallium nitride-based compound semiconductor light emitting device of the present invention.

As shown in FIG. 5, Pt that forms the contact metal layer 11 is present in the mixed positive electrode-metal layer 15*b* located in the vicinity of the contact-metal-layer-11-side interface of the p-type semiconductor layer 5*b* composed of p-type GaN, while on the other hand, Ga that composes the p-type semiconductor layer 5*b* composed of GaN is present in the mixed semiconductor-metal layer 15*a* located in the vicinity of the p-type-semiconductor-layer-5*b*-side interface of contact metal layer 11.

Here, Cu peaks in the chart are the result of the X-rays used for measurement.

Next, a negative electrode 20 was formed on the exposed n-type GaN contact layer 3*b* according to the following procedure. After uniformly coating a resist over an entire surface, the resist was removed from a region where the negative electrode was formed on the exposed n-type GaN contact layer using a known lithography technology to form the negative electrode composed of Ti at 100 nm and Au at 200 nm in order from the semiconductor side using a routinely used vacuum deposition. The resist was subsequently removed by a known method.

A thickness of the substrate on which the positive electrode 10 and the negative electrode 20 were formed in this manner was reduced to 80 μm by grinding and polishing a rear surface of the substrate, and after forming ruled lines on the semiconductor layer side using a laser scrubber, the substrate was split apart and cut into square chips measuring 350 μm on a side. Continuing, when a forward voltage of these chips was measured using a needle probe while supplying power and applying current of 20 mA, the forward voltage was found to be 2.9 V.

Subsequently, when the chips were mounted in a TO-18 lead package and measured for an emission output with a tester, the emission output at an applied current of 20 mA was 4 mW. In addition, the emission distribution of the emitting surface was confirmed to be such that light was emitted over the entire surface above the positive electrode.

Comparative Example 1

A gallium nitride-based compound semiconductor light emitting device was produced in the same manner as Example with the exception of not providing the current diffusion layer. A forward voltage and an emission output of this light emitting device were 3.1 V and 3.7 mW, respectively. Observation of its light emitting surface revealed that emission above the electrode was limited to only a periphery of the bonding pad layer and a portion that centered about a line passing through the negative electrode from the bonding pad layer.

The reason of this was most likely high electrical resistance in the planar direction of the contact metal layer that prevented the spread of current on the contact metal layer.

Comparative Example 2

A gallium nitride-based compound semiconductor light emitting device was produced in the same manner as Example with the exception of not providing the current diffusion layer and making a thickness of the contact metal layer 12 nm. A forward voltage and an emission output of this light emitting device were 2.9 V and 3.0 mW, respectively. Observation of its light emitting surface revealed that, although emission of light was confirmed over the entire surface as in Example, an optical transmissivity of the contact metal layer had decreased to about 30%, resulting in a decrease in emission output.

INDUSTRIAL APPLICABILITY

An electrode for a gallium nitride-based compound semiconductor light emitting device provided by the present invention is useful as a positive electrode of a translucent gallium nitride-based compound semiconductor light emitting device.

The invention claimed is:

1. A gallium nitride-based compound semiconductor light emitting device comprising an n-type semiconductor layer, a light emitting layer, and a p-type semiconductor layer that are composed of gallium nitride-based compound semiconductors and are deposited in that order on a substrate, and further comprising a negative electrode and a positive electrode that are in contact with the n-type semiconductor layer and the p-type semiconductor layer, respectively, wherein the positive electrode has a translucent electrode composed of a three-layer structure including a contact metal layer that contacts at least the p-type semiconductor layer, a current diffusion layer provided on the contact metal layer and having conductivity greater than that of the contact metal layer, and a bonding pad layer provided on the current diffusion layer, a first mixed positive electrode-metal layer is present in the p-type semiconductor layer at the positive-electrode-side surface, the first mixed positive electrode-metal layer includes a metal that forms the contact metal layer, a percentage of the amount of the metal that forms the contact metal layer in the first mixed positive electrode-metal layer to a total amount of metals in the first mixed positive electrode-metal layer is 0.01 to 30 atomic percent, a second mixed semiconductor-metal layer is present in the contact metal layer at the p-type-semiconductor-layer-side surface, the second mixed semiconductor-metal layer includes a group III metal, a percentage of the amount of the group III metal in the second mixed semiconductor-metal layer to a total amount of metals in the second mixed semiconductor-metal layer is 0.1 to 50 atomic percent, and the contact metal layer is of a platinum group metal or Ag.

2. The gallium nitride-based compound semiconductor light emitting device according to claim 1, wherein a thickness of the first mixed positive electrode-metal layer is 0.1 to 10 nm.

3. The gallium nitride-based compound semiconductor light emitting device according to claim 1, wherein a thickness of the second mixed semiconductor-metal layer is 0.1 to 2.5 nm.

4. The gallium nitride-based compound semiconductor light emitting device according to claim 1, wherein the contact metal layer is of platinum.

5. The gallium nitride-based compound semiconductor light emitting device according to claim 1, wherein a thickness of the contact metal layer is 0.1 to 7.5 nm.

6. The gallium nitride-based compound semiconductor light emitting device according to claim 1, wherein a thickness of the contact metal layer is 5 nm or less.

7. The gallium nitride-based compound semiconductor light emitting device according to claim 1, wherein a thickness of the contact metal layer is 0.5 to 2.5 nm.

8. The gallium nitride-based compound semiconductor light emitting device according to claim 1, wherein the current diffusion layer is of a metal selected from the group consisting of gold, silver, copper, and an alloy including at least one thereof.

9. The gallium nitride-based compound semiconductor light emitting device according to claim 1, wherein the current diffusion layer is of gold.

10. The gallium nitride-based compound semiconductor light emitting device according to claim 1, wherein a thickness of the current diffusion layer is 1 to 20 nm.

11. The gallium nitride-based compound semiconductor light emitting device according to claim 1, wherein a thickness of the current diffusion layer is 10 nm or less.

12. The gallium nitride-based compound semiconductor light emitting device according to claim 1, wherein a thickness of the current diffusion layer is 3 to 6 nm.

13. The gallium nitride-based compound semiconductor light emitting device according to claim 1, wherein the bonding pad layer includes a eutectic solder material.

14. The gallium nitride-based compound semiconductor light emitting device according to claim 1, wherein the bonding pad layer includes Au, Sn, or a tertiary solder alloy including Au and Sn.

* * * * *